United States Patent [19]

Nagate et al.

[11] Patent Number: 5,437,960
[45] Date of Patent: Aug. 1, 1995

[54] PROCESS FOR LAMINATING PHOTOSENSITIVE LAYER

[75] Inventors: Hiroshi Nagate; Hiroya Endo; Ken-ichi Miyata, all of Shizuoka, Japan

[73] Assignee: Fuji Photo Film Co., Ltd., Kanagawa, Japan

[21] Appl. No.: 286,457

[22] Filed: Aug. 5, 1994

[30] Foreign Application Priority Data

Aug. 10, 1993 [JP] Japan .................. 5-198469
Aug. 19, 1993 [JP] Japan .................. 5-205394

[51] Int. Cl.$^6$ .................. G03C 1/805; G03C 11/12
[52] U.S. Cl. .................. 430/256; 430/258; 430/260; 430/259; 430/262; 430/263; 156/234; 156/238
[58] Field of Search .......... 430/256, 258, 260, 262, 430/263, 259; 156/234, 238

[56] References Cited

U.S. PATENT DOCUMENTS

5,358,591 10/1994 Candore .................. 430/256

Primary Examiner—Richard L. Schilling
Attorney, Agent, or Firm—Sughrue, Mion, Zinn, Macpeak & Seas

[57] ABSTRACT

A process for laminating a photosensitive-layer which includes providing (A) a base having a laminating region and a non-laminating region, and (B) a support having thereon, in order, a photosensitive layer and a protective film, where part of the protective film corresponds to the laminating region and part of the protective film corresponds to the non-laminating region, removing the part of the protective film which corresponds to the laminating region from the photosensitive layer such that the photosensitive layer can be laminated to the base in the laminating region, feeding the base and the support having thereon the photosensitive layer from which protective film has been removed to a nip between a pair of heated pressure rollers, passing the base and photosensitive-layer-covered support forward through the rollers while the base and photosensitive-layer-covered support are being nipped and hot-pressed by the rollers, with the photosensitive layer being in contact with the laminating region of the base to laminate the photosensitive layer to the base, and then peeling the support from the photosensitive layer, wherein the removal of protective film from the photosensitive layer is conducted in such a manner that the part of the protective film which corresponds to the non-laminating region of the base is left on the photosensitive layer.

15 Claims, 4 Drawing Sheets

PROCESS FOR LAMINATING PHOTOSENSITIVE LAYER

FIELD OF THE INVENTION

The present invention relates to a process for laminating a photosensitive layer to a base by hot-pressing a support having thereon the photosensitive layer covered with a protective film against the base.

BACKGROUND OF THE INVENTION

A conventional process for laminating a photosensitive-layer comprises removing beforehand that part of a photosensitive layer disposed on a beltlike support which corresponds to the non-laminating region of a base sheet, subsequently feeding the resulting photosensitive-layer-covered beltlike support to the nip between a pair of heated pressure rollers along with the base sheet, and then passing the base sheet and the photosensitive-layer-covered beltlike support forward while the base sheet and the photosensitive-layer-covered beltlike support continue to be nipped and hot-pressed by the rollers, with the photosensitive layer being in contact with the base sheet, to thereby laminate the photosensitive layer to the base sheet.

However, the above-described technique in which that part of the photosensitive layer on a beltlike support which corresponds to the non-laminating region of a base is removed beforehand has had the following drawbacks. First, since the peeling and removal of part of the photosensitive layer result in flying photosensitive-layer debris which deposit on the photosensitive layer in the laminating region, the deposited debris are sandwiched between the base and the photosensitive layer to cause defects if the photosensitive layer having the debris adherent thereto is subjected to hot pressing as it is.

A second drawback of the technique described above is that if the adherence of the photosensitive layer to the support is high, the photosensitive layer breaks when partly peeled from the support, and at least part of the photosensitive layer which should be peeled off remains on the support and adheres to the non-laminating region of the base to cause defects.

SUMMARY OF THE INVENTION

Therefore, one object of the present invention is to eliminate the defects resulting from the deposition of photosensitive-layer debris in the laminating region.

A second object of the present invention is to prevent the adhesion of the photosensitive layer on the base in its non-laminating region.

The above-described objects and other objects of the present invention have been accomplished by a process in which a base and a photosensitive-layer-covered support are hot-pressed with nipping with that part of a protective film which corresponds to the non-laminating region of the base being left on the photosensitive layer, namely, by a process comprising cutting beforehand the protective film and the photosensitive layer along the boundary with the region in which the protective film is to be left on the photosensitive layer, removing the protective film except for its part in the non-laminating region being left unremoved, hot-pressing the base and the photosensitive-layer-covered support with nipping, and then pulling that region of the support in which the protective film remains on the photosensitive layer to thereby peel the support from the photosensitive layer in the laminating region.

By removing the protective film in such a manner that its part corresponding to the non-laminating region of the base is left on the photosensitive layer and hot-pressing the base and the photosensitive-layer-covered support with nipping, the non-laminating region can be formed without peeling off the photosensitive layer. Consequently, the undesired dust generation by photosensitive-layer peeling can be prevented and, hence, the defects caused by the deposition of photosensitive-layer debris in the laminating region can be eliminated.

Further, since the non-laminating region of the base comes into contact with a protective film which has no debris adhering to its surface and which does not have adhesion properties, fouling can be prevented.

By cutting the protective film and the photosensitive layer, before removing the protective film, along the boundary with the region in which the protective film is to be left on the photosensitive layer and by removing the protective film except for its part corresponding to the non-laminating region of the base being left on the photosensitive layer, there is no fear of adhesion of cutting debris to the photosensitive layer to cause defects even when the cutting of the protective film and photosensitive layer results in generation of cutting debris, because the laminating region is still covered with the protective film. The cutting debris are removed simultaneously with the removal of the protective film.

When the support is peeled from the photosensitive layer in the laminating region, after the photosensitive-layer-covered beltlike support and the base are hot-pressed with nipping, by pulling that region of the support in which the protective film remains on the photosensitive layer, the photosensitive layer in the laminating region is never peeled from the base.

In the case where the support is to be peeled from the photosensitive layer in the laminating region, after the hot-pressing of the photosensitive-layer-covered beltlike support and the base with nipping, by pulling that region of the support in which the protective film remains on the photosensitive layer, the pulling of the region of the support in which the protective film remains on the photosensitive layer can be easily attained because the photosensitive layer in that region is not in contact with the base surface and, hence, the support can thus be peeled off easily.

Accordingly, the present invention is directed to a process which comprises providing (A) a base having a laminating region and a non-laminating region, and (B) a support having thereon, in order, a photosensitive layer and a protective film, where part of the protective film corresponds to the laminating region and part of the protective film corresponds to the non-laminating region, removing the part of the protective film which corresponds to the laminating region from the photosensitive layer such that the photosensitive layer can be laminated to the base in the laminating region, feeding the base and the support having thereon the photosensitive layer from which protective film has been removed to a nip between a pair of heated pressure rollers, passing the base and photosensitive-layer-covered support forward through the rollers while the base and photosensitive-layer-covered support are being nipped and hot-pressed by the rollers, with the photosensitive layer being in contact with the laminating region of the base to laminate the photosensitive layer to the base, and the peeling the support from the photosensitive layer, wherein the removal of protective film from the photosensitive layer is conducted in such a manner that the part of the protective film which corresponds to the non-laminating region of the base is left on the photosensitive layer.

DESCRIPTION OF PREFERRED EMBODIMENTS

The present invention will now be described by reference to the Examples set forth below, but it should not be construed as being limited thereto.

EXAMPLE 1

Figure 1:
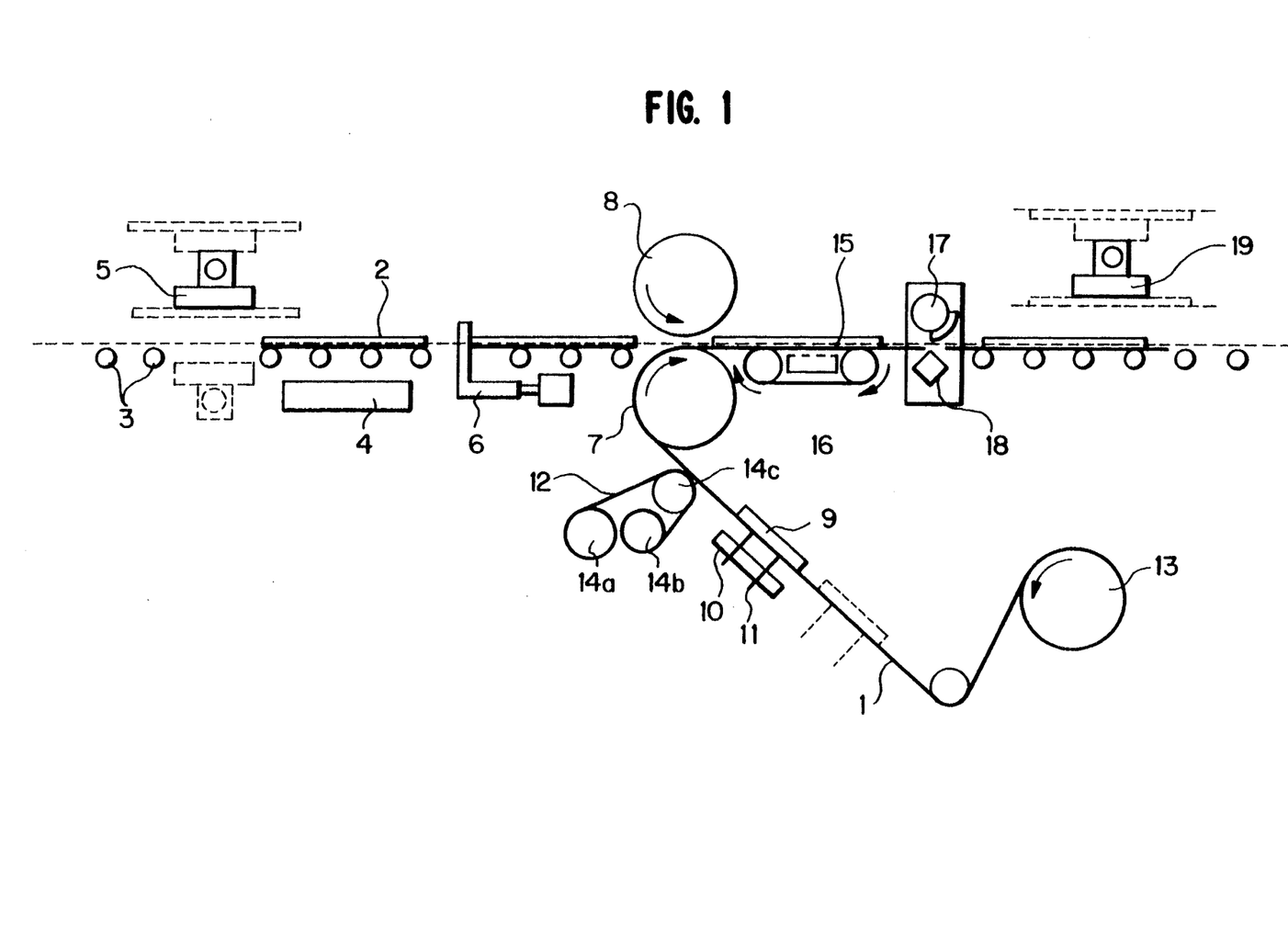
FIG. 1 is a schematic view of a photosensitive-layer laminating apparatus for use in practicing the process for laminating a photosensitive layer according to the invention.

FIG. 1 shows a schematic view of a photosensitive-layer laminating apparatus for use in practicing the process for laminating a photosensitive layer according to the invention. The photosensitive-layer laminating apparatus comprises a base sheet turnover part, a base sheet heating part, a protective film/photosensitive layer cutting part, a protective film removing part, a photosensitive layer hot-pressing part, a beltlike support cutting part, and a base sheet return part.

In the base sheet turnover part, a base sheet 2 sent from the left in FIG. 1 with conveyor rollers 3 is held from the lower side and lifted by a turnover arm 5, and the arm is rotated to turn the base sheet 2 over. The base sheet 2 is then placed on the conveyor rollers 3 to thereby cause the hot-pressing side of the base sheet 2 to face downward. Although the holding of the base by the turnover arm 5 is accomplished by means of suction, a mechanical hand, etc., it is absolutely necessary in this embodiment that the holding be conducted by contact with not the front side of the base sheet but the back side or edge(s) thereof. Examples of the conveyance other than rollers 3 include roller conveyance, belt conveyance, carrier conveyance, and robot conveyance. Although the back side of the base sheet 2 may be in contact with the conveying means until the base sheet is overturned, the base sheet 2 after turnover is conveyed with only edges thereof being in contact with the conveyor rollers 3 so as to avoid the contact of the lower side of the base sheet 2 with the conveyor rollers 3.

In the base sheet heating part, the base sheet 2 is heated with a heater 4 to about 50° to 110° C., preferably 80° to 100 ° C. Examples of the heater 4 include a far infrared heater, nichrome wire heater, and hot air heater. The heater 4 may be disposed on the upper or lower side of the base sheet 2 or on both sides. Examples of the base sheet 2 include a copper-clad glass-epoxy resin base for use as a printed-board substrate and a glass sheet.

A roll 13 of a photosensitive-layer-covered beltlike support 1 is unwound, with a protective film 22 (shown in FIG. 2) being left unremoved. The unwound photosensitive-layer-covered beltlike support 1 is sent to the protective film/photosensitive layer cutting part, where the protective film and the photosensitive layer are cut along the boundary with a non-laminating region, and the protective film in a laminating region is removed in the protective film removing part.

The protective film/photosensitive layer cutting part comprises a securing table 9 and a slide table 10. The securing table 9 serves to secure the photosensitive-layer-covered beltlike support 1 and is capable of traveling in the direction in which the photosensitive-layer-covered beltlike support 1 is conveyed. The slide table 10 has cutter blades 11 fixed thereto and which travels in a direction perpendicular to the conveyance direction for the photosensitive-layer-covered beltlike support 1, i.e., in the direction in which the protective film is to be cut.

At the time of cutting the protective film and the photosensitive layer, the securing table 9 for securing the photosensitive-layer-covered beltlike support 1 travels at the same speed at which the photosensitive-layer-covered beltlike support 1 is conveyed, while securing the photosensitive-layer-covered beltlike support 1. Upon completion of the cutting of the protective film and the photosensitive layer, the securing table 9 releases the photosensitive-layer-covered beltlike support 1 and returns to its starting position.

On the slide table 10 are disposed two cutter blades 11 which are oriented perpendicularly to the direction of the flow of the photosensitive-layer-covered beltlike support 1 and are apart from each other at a distance equal to the width over which the protective film is to be left unremoved. The blades 11 are fixed so as to come into contact with the protective film at an adjustable constant pressure by means of, e.g., a cylinder or spring.

The protective film/photosensitive layer cutting operation is performed as follows. First, the securing table 9 secures the photosensitive-layer-covered beltlike support 1 and travels at the same speed as the conveyance speed for the photosensitive-layer-covered beltlike support 1, while the cutter blades 11 of the slide table 10 are pushed against the securing table 9 and travel in the cutting direction. The cutter blades 11 cut the protective film and the photosensitive layer on the photosensitive-layer-covered beltlike support 1. This slide table 10 is constructed so that the cutter blades 11 move back after they have traveled at least to the edge of the photosensitive-layer-covered beltlike support 1.

In this protective film/photosensitive layer cutting operation, the protective film and the photosensitive layer can be cut perpendicularly to the longitudinal direction of the photosensitive-layer-covered beltlike support 1 even when the photosensitive-layer-covered beltlike support 1 is being conveyed, because the securing table 9 and the slide table 10 for the photosensitive-layer-covered beltlike support 1 is traveling at the same speed as the conveyance speed of the photosensitive-layer-covered beltlike support 1.

When the protective film and the photosensitive layer are cut, dust particles generated may be removed by suction or may be blown away with a downward clean air stream to a downstream area where there is no fear of causing a fouling problem. By taking such a measure for cleaning, defects are diminished. For the purpose of improving the sharpness of the cutter blades 11 to reduce the generation of cutting debris from the photosensitive layer, heating may be conducted of the cutter blades 11, the securing table 9 for the photosensitive-layer-covered beltlike support 1, and the photosensitive-layer-covered beltlike support 1 itself to 50° to 100° C.

The protective film removing part is located next to the protective film/photosensitive layer cutting part in the conveying system for the photosensitive-layer-covered beltlike support. This protective film removing part has a protective film removing unit comprising an unwinding roller 14b for unwinding an adhesive tape, a recovering roller 14a, and a pushing roller 14c for pushing the adhesive tape against the protective film. The protective film removing unit has such a mechanism that it moves up and down relative to the photosensitive-layer-covered beltlike support.

When the cut line formed in the protective film at the front end of the laminating region has been moved to the protective film removing unit, the adhesive tape pushing roller 14c in the unit pushes the adhesive tape against the protective film to bring the adhesive tape into intimate contact with the protective film. The adhesive tape unwinding roller 14b, the recovering roller 14a, and the pushing roller 14c rotate at the same speed as the conveyance speed of the photosensitive-layer-covered beltlike support and begin to peel off the protective film from the photosensitive layer and, simultaneously with the peeling, wind it on the recovering roller 14a. When the cut line which is the boundary with the adjacent non-laminating region has approached to the protective film removing unit, the unit separates from the photosensitive-layer-covered beltlike support. Thus, the protective film on the laminating region ending with the cut line is removed, with the protective film in the non-laminating region being left on the photosensitive layer.

Examples of other methods usable for removing the protective layer from the photosensitive layer include those based on, besides pressure-sensitive adhesion, electrostatic attraction, vacuum, fusion, etc. Examples of mechanisms other than rollers include a bar, a pickup, and non-contact ones, e.g., air blowing.

In an example of the method based on vacuum, a rotary vacuum drum having a high vacuum chamber and a low vacuum chamber is used for removing the protective film from the photosensitive layer. That is, only the region to be removed of the running protective film (i.e., the laminating region) is brought into contact with the surface connected to the high vacuum chamber of the rotating vacuum drum and removed by attraction from the photosensitive layer. The subsequent protective film in the non-laminating region runs in contact with the surface connected to the low vacuum chamber of the vacuum drum and thus is transported, as it is held on the photosensitive layer, to a laminating apparatus for tha base.

The hot-pressing part comprises a pair of heated pressure rollers arranged opposite from each other with a base sheet therebetween, i.e., an upper heated pressure roller 8 disposed above the base sheet and a lower heated pressure roller 7 disposed below it. The upper heated pressure roller 8 has such a structure that its both ends can be pressed downward with, e.g., a cylinder. The upper and lower heated pressure rollers serve, in co-operation with each other, to hot-press a base sheet together with a photosensitive-layer-covered beltlike support and to hold and convey the base sheet. When there is no base sheet being nipped by the upper and lower heated pressure rollers, they are apart from each other at a distance smaller than the base sheet thickness. Each of the heated pressure rollers 8 and 7 is a stainless-steel roller whose surface is covered with an elastomeric material, e.g., silicone rubber, and is kept heated at about 100° to 150° C. with an induction heater, sheathed heater, or the like disposed inside.

The photosensitive-layer-covered beltlike support 1 is wound around the lower heated pressure roller 7, with edges of the support 1 being held on a suction belt 15 disposed on the outlet side of the heated pressure rollers. The suction belt 15 moves at the same speed as the conveyance speed of the photosensitive-layer-covered beltlike support 1, and holds edges of the photosensitive-layer-covered beltlike support 1 from the lower side by means of suction by a suction device 16 disposed under the conveying belt, which is perforated. In the case where base sheets 2 do not come successively, the heated pressure rollers 7 and 8 and the suction belt 15 continue to rotate or move at the same speed as the conveyance speed of the photosensitive-layer-covered beltlike support 1, while holding the photosensitive-layer-covered beltlike support 1.

When a base sheet 2 which has been preheated and turned over comes from the left, it stops at a base sheet pushing mechanism to stand by. An end of that part of the photosensitive-layer-covered beltlike support 1 in which the protective film has been removed is sensed by a sensor based on a change in the reflective index or transmittance, upon which the base sheet 2 is pushed by the pushing mechanism 6 into the nip between the heated pressure rollers 7 and 8 synchronously with the photosensitive-layer-covered beltlike support 1 conveyed at a constant speed, in such a manner that the end of the part in which the protective film has been removed meets the base sheet 2 in its predetermined position. Simultaneously with the entrance of the front edge of the base sheet 2 into the nip, it is pressed from the upper side by the upper heated pressure roller 8 to hot-press the photosensitive-layer-covered beltlike support 1 together with the base sheet 2. At the time when the photosensitive-layer-covered beltlike support 1 has been hot-pressed with the base sheet 2 to the rear edge of the base sheet 2, the pressing by the upper heated pressure roller 8 is ceased and the heated pressure rollers 7 and 8 are positioned apart from each other at a distance smaller than the base sheet thickness.

In the course of the above-described laminating, the next base sheet is preheated and turned over and stands by at the base sheet pushing mechanism. An end of the next part of the photosensitive-layer-covered beltlike support 1 in which the protective film has been removed is sensed, upon which the base sheet is pushed by the pushing mechanism into the nip between the heated pressure rollers 7 and 8 synchronously with the photosensitive-layer-covered beltlike support 1 conveyed at a constant speed, in such a manner that the end of the part in which the protective film has been removed meets the base sheet in its predetermined position. Thus, base sheets 2 are continuously hot-pressed together with the photosensitive-layer-covered beltlike support 1 without stopping the conveyance of the photosensitive-layer-covered beltlike support 1. The pressure applied between the pair of heated pressure rollers 7 and 8 is generally 5 to 50 kg/cm.

It should be noted that the holding of edges of the photosensitive-layer-covered beltlike support 1 on the suction belt 15 is provisional for the period in which base sheets 2 are not successively fed to the heated pressure rollers 7 and 8. Hence, during the period in which base sheets 2 are fed and laminating is conducted continuously, the suction device under the suction belt 15 is kept stopped and the photosensitive-layer-covered beltlike support 1 is stuck to the base sheets 2 and conveyed along with the base sheets 2. The conveyance speed is generally 0.1 to 3.0 m/min.

The beltlike support cutting part comprises a fixed blade 18 and a rotary blade 17 respectively disposed below and above the conveyance level for base sheets 2 to which the photosensitive-layer-covered beltlike support 1 is stuck. The cutting part cuts the beltlike support 1 between base sheets, i.e., in the areas where the protective film and the photosensitive layer remain, to thereby separate the base sheets.

Besides the function described above, the beltlike support cutting part serves as follows. Even when base sheets 2 do not come successively, the front part of the photosensitive-layer-covered beltlike support 1 is cut off with the rotary cutter 17, because the heated pressure rollers 7 and 8 and the suction belt 15 continue to rotate or move synchronously with the conveyance of the photosensitive-layer-covered beltlike support 1 while holding the photosensitive-layer-covered beltlike support 1 and, hence, the photosensitive-layer-covered beltlike support 1 is continuously fed to the beltlike support cutting part. The cut pieces of the beltlike support 1 fall into a recovery box placed underneath and are thus recovered.

Each of the separated base sheets 2 to which the photosensitive-layer-covered beltlike support 1 has been laminated by hot pressing is conveyed, with the beltlike support protruding from edges thereof, to the base sheet return part, where each base sheet 2 is held from its backside on a base sheet return arm 19 disposed over it and is then lifted, turned over (i.e., returned to the original facing direction) by rotating the base sheet return arm 19, and then placed on the conveyor rollers 3. The base sheets 2 are thereafter sent to the subsequent step or recovered in a base sheet cassette, with the hot-pressing side thereof facing upward.

Figure 2:
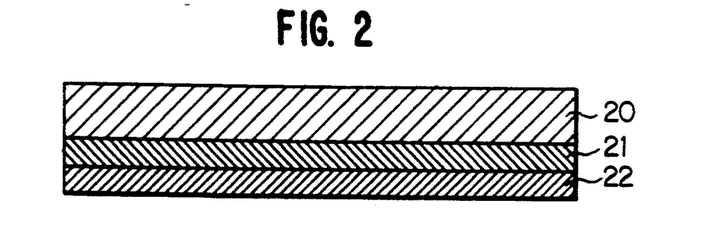
FIG. 2 is a sectional view of one embodiment of the photosensitive-layer-covered beltlike support 1 for use in the invention.

FIG. 2 is a sectional view of one embodiment of the photosensitive-layer-covered beltlike support for use in Example 1 of the present invention. The photosensitive-layer-covered beltlike support comprises a beltlike support 20, a photosensitive layer 21 disposed thereon, and provided on the photosensitive layer 21 a protective film 22 for protecting the photosensitive layer 21. As the beltlike support 20, use may generally be made of a film made of poly(ethylene terephthalate), polypropylene, or other polymers (generally having a thickness of 20 to 100 $\mu$m). The photosensitive layer 21 is one consisting of a photopolymerizable resist and generally has a thickness of 0.5 to 10 $\mu$m. As this photopolymerizable resist, any material may be used without particular limitations. There are cases where an interlayer is disposed between the beltlike support 20 and the photosensitive layer 21 in order to improve suitability for hot pressing. This interlayer is, for example, a poly(vinyl alcohol) layer and generally has a thickness of 10 to 50 $\mu$m.

The protective layer 22 may be made of polyethylene, polypropylene, poly(ethylene terephthalate), chlorinated polyethylene and polytetrafluoroethylene and silicone-coated paper and generally has a thickness of 1 to 100 $\mu$m, preferably 10 to 30 $\mu$m.

Figure 3:
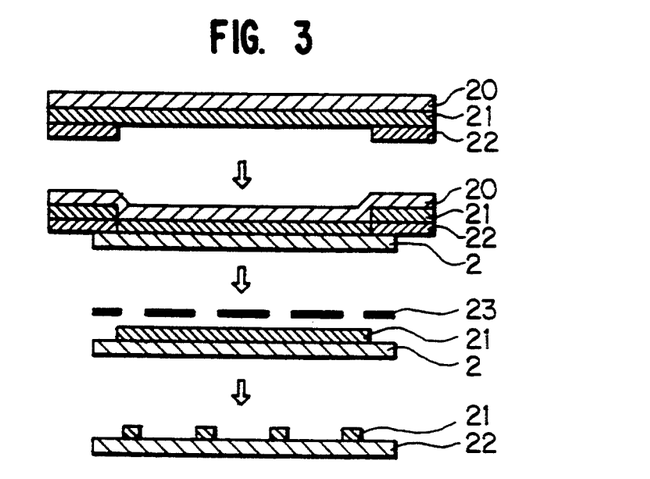
FIG. 3 illustrates one embodiment of base patterning steps which use the process for laminating a photosensitive layer according to the invention.

FIG. 3 illustrates one embodiment of base patterning steps which use the process for laminating a photosensitive layer laminating according to the present invention.

First, a photosensitive-layer-covered beltlike support in which the protective film 22 remains in the non-laminating regions is hot-pressed with a base sheet 2 using the photosensitive-layer laminating process of the present invention. The beltlike support 20 is then peeled off along with the photosensitive layer 21 and protective film 22 which are located in the non-laminating regions, thereby laminating the photosensitive layer 21 to the base sheet 2 in its laminating region. Subsequently, the laminated photosensitive layer is exposed to ultraviolet radiation through a pattern mask 23 to print the pattern on the photosensitive layer 21. Upon development, the unexposed parts of the photosensitive layer 21 dissolve in the developing solution and only the exposed parts of the photosensitive layer 21 remain. Thus, a patterned is formed on the base sheet. This patterned layer is thereafter used to form a functional image or as a resist for the etching of the base.

EXAMPLE 2

FIG. 4 illustrates an auto-cutting laminator for use in practicing the present invention, which laminator hot-presses a photosensitive-layer-covered beltlike support together with base sheets while cutting the photosensitive-layer-covered beltlike support into sheets.

The auto-cutting laminator is first explained with respect to its structure.

Figure 4A:
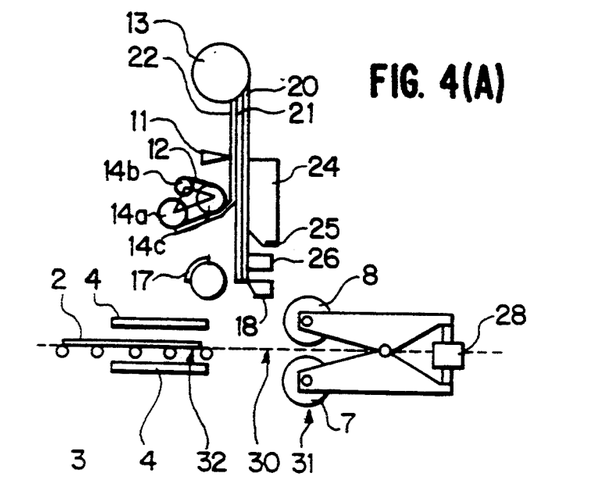
FIGS. 4(A)–4(F) illustrate an auto-cutting laminator for use in the invention.

As illustrated in FIG. 4(A), base sheets 2 are conveyed from the left to right with a conveying mechanism consisting mainly of conveyor rollers 3. Heaters 4 for base sheet heating are disposed above and below the conveyor rollers 3.

A roll 13 of a photosensitive-layer-covered beltlike support having a protective film 22 is unwound, and the unwound photosensitive-layer-covered beltlike support is passed between left-side components comprising a protective film/photosensitive layer cutter 11, a protective film peeling unit 14, and a rotary blade 17 and right-side components comprising a vacuum plate 24, a support holding member 26, and a fixed blade 18.

The protective film/photosensitive layer cutter 11 is movable so as to cut the photosensitive-layer-covered beltlike support in a transverse direction, and is pushed against the protective film 22 at a proper pressure to cut the protective film 22 and the photosensitive layer 21 without cutting the beltlike support 20.

The protective film peeling unit 14 comprises an adhesive tape-unwinding roll 14b, an adhesive tape pushing roller 14c, and a protective film recovering roll 14a. An adhesive tape 12 unwound from the adhesive tape-unwinding roll 14b is wound around the adhesive tape pushing roller 14c with the adhesive layer facing outward, and is recovered by winding it on the protective film recovering roll 14a. The adhesive tape pushing roller 14c functions to push the adhesive tape against the protective film 22 at an adequate pressure by means of, e.g., an air cylinder. The protective film recovering roll 14a rotates so as to recover the protective film 22 by winding it thereon according to the amount of the photosensitive-layer-covered beltlike support conveyed.

The rotary cutter comprises a shaft and the rotary blade 17 attached thereto in a twisted state. When the shaft rotates, the rotary blade 17 acts with the fixed blade 18 to transversely cut the photosensitive-layer-covered beltlike support located therebetween which has a protective film.

The vacuum plate 24 holds the beltlike support 20 by suction and is movable up and down by means of an air cylinder. The vacuum plate 24 has, at its tip, a heater 25 for provisional bonding.

The support holding member 26 holds the beltlike support 20 by suction during the time when the rotary cutter is operated, and is movable right and left along with the fixed blade 18.

There are a pair of heated pressure rollers, i.e., an upper heated pressure roller 8 and a lower heated pressure roller 7. The two rollers are opened and closed by means of leverage by operating an air cylinder 28. The pressure for hot pressing is controlled by regulating the air pressure in the air cylinder 28. The heated pressure roller system is movable back and forth in the direction of conveyance of base sheet 2. When a base sheet 2 is to be hot-pressed with the heated pressure rollers 7 and 8, the rollers 7 and 8 move to a hot-pressing position 30 on the left side to nip the base sheet 2. The heated pressure rollers 7 and 8 otherwise are located at a standby position 31 on the right side.

Next, the mechanism of the auto-cutting laminator is explained.

As shown in FIG. 4(A), a photosensitive-layer-covered beltlike support having a protective film 22 and manually unwound from its roll 13 disposed above is held with both of the vacuum plate 24 and the support holding member 26 by suction in preparation for the laminating of the photosensitive-layer-covered beltlike support to a base sheet 2.

The front edge of the photosensitive-layer-covered beltlike support having a protective film is trimmed with the rotary blade 17 and a fixed blade 18, and the protective film 22 is peeled from the front edge part of the photosensitive-layer-covered beltlike support. The front edge part of the peeled protective film is brought into intimate contact with the adhesive tape 12 wound around the adhesive tape pushing roller 14c and protective film recovering roll 14a in the protective film peeling unit 14, while avoiding rumpling of the protective film.

Thus, the laminator is ready for the reception of a base sheet 2 to be conveyed with the conveyor rollers 3.

Figure 4B:
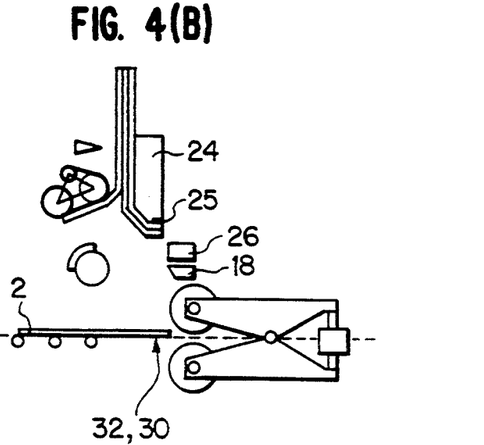

With the initiation of a series of laminating operations, a base sheet 2 preheated to a predetermined temperature with the heaters 4 is conveyed with the conveyor rollers 3. When the front end 32 of the photosensitive-layer laminating region of the base sheet 2 approaches to the hot-pressing position 30, the approach is detected and the front end 32 of the photosensitive-layer laminating region is stopped at the hot-pressing position 30 based on a detection signal, as shown in FIG. 4(B).

The support holding member 26 and the fixed blade 18 are moved to a standby position 31 on the right side to separate the front edge part of the photosensitive-layer-covered beltlike support from the support holding member 26, and the front edge part of the photosensitive-layer-covered beltlike support is held on the tip of the vacuum plate 24 by suction and heated with the provisional-bonding heater 25.

Figure 4C:
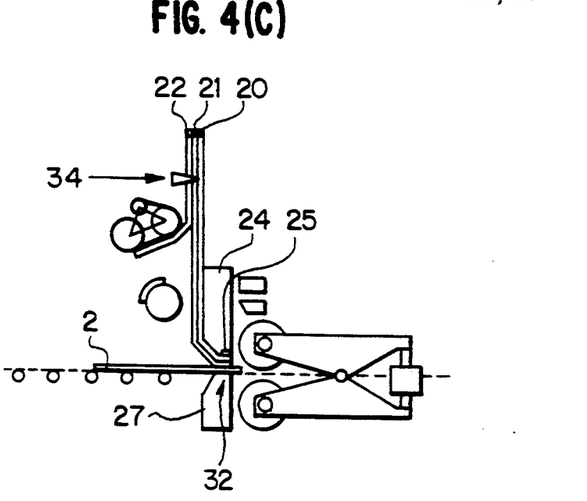

The front edge part the photosensitive-layer-covered beltlike support is then pushed at an adequate pressure against the front end 32 of the photosensitive-layer laminating region of the base sheet 2 with the provisional-bonding heater 25 as shown in FIG. 4(C) to conduct provisional bonding. In order to prevent the base sheet 2 from bending due to the pushing pressure in this provisional bonding, a support table 27 having the same shape as the vacuum plate 24 ascends to support the base sheet 2 from beneath it.

At the time of provisional bonding, the cutter blades 11 located at the rear end 34 of the photosensitive-layer laminating region of the photosensitive-layer-covered beltlike support is operated to cut the protective film 22 and the photosensitive layer 21.

Figure 4D:
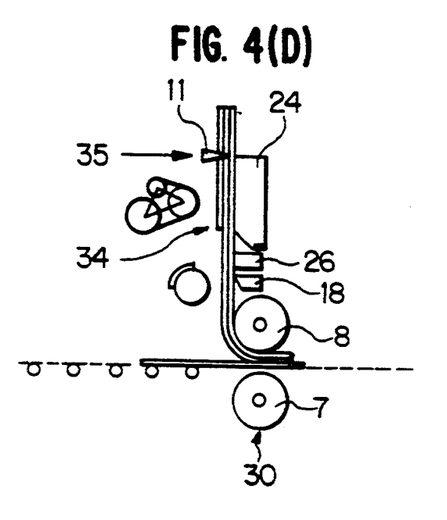

Subsequently, as shown in FIG. 4(D), the suction for holding the photosensitive-layer-covered beltlike support is ceased to separate the vacuum plate 24 and its tip from the part in which the photosensitive layer has been provisionally bonded. At the time when the vacuum plate 24 has completed its separation movement, the fixed blade 18 and the support holding member 26 are brought close to the beltlike support 20.

The heated pressure rollers 7 and 8 move from their standby position to the hot-pressing position 30 and come into contact with the front end of the photosensitive-layer laminating region of the base sheet at an adequate pressure. The base sheet is conveyed by both the rotation of the heated pressure rollers 7 and 8 and the restarted rotation of the conveyor rollers 3, while the photosensitive-layer-covered beltlike support is automatically fed with the rotation of the heated pressure rollers 7 and 8. In this manner, the photosensitive-layer-covered beltlike support is laminated by hot pressing on the base sheet in the photosensitive-layer laminating region from the front end to the rear end over a predetermined distance.

During the period in which the base sheet and the photosensitive-layer-covered beltlike support are being conveyed with the heated pressure rollers 7 and 8, the peeling of the protective film 22 proceeds. The peeling of the protective film 22 is completed after the peeling of the protective film 22 has reached to the rear end 34 of the photosensitive-layer laminating region of the photosensitive-layer-covered beltlike support at which the protective film and the photosensitive layer have been cut.

When the rear end 35 of the region of the photosensitive-layer-covered beltlike support in which the protective film is to be left unremoved has come to the position of the cutter 11 as the photosensitive-layer-covered beltlike support is conveyed, the cutter 11 is operated to cut the protective film and the photosensitive layer.

The position of the rear end 35 of the region of the photosensitive-layer-covered beltlike support in which the protective film is to be left unremoved is determined between the rear edge of the base sheet and the position where the photosensitive-layer-covered beltlike support is to be cut with the rotary cutter, so that the photosensitive layer is prevented from coming into contact with the base sheet in its non-laminating regions and that the protective film does not remain in the part corresponding to the front end of the photosensitive-layer laminating region of the base sheet to be laminated next.

Figure 4E:
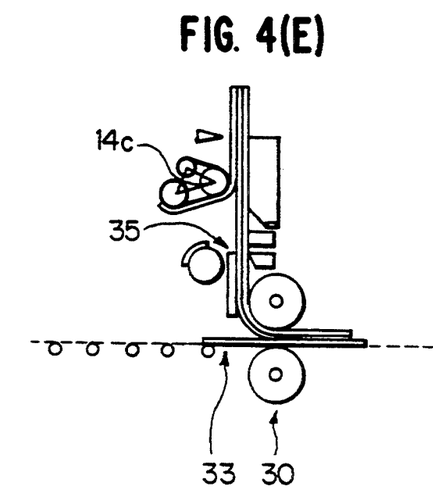

Subsequently, when the cut line at the rear end 35 of the region in which the protective film is to be left unremoved has come to the position of the adhesive tape pushing roller 14c, the adhesive tape pushing roller 14c is pushed again to begin to peel off the protective film as shown in FIG. 4(E).

Figure 4F:
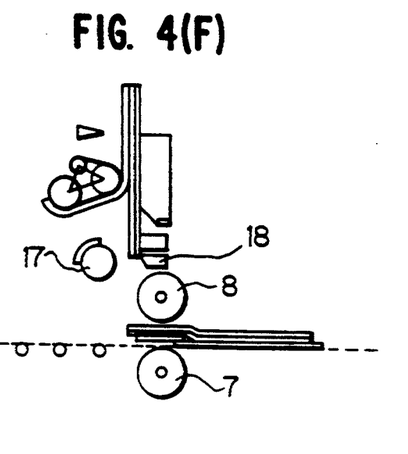

When the rear end 33 of the photosensitive-layer laminating region of the base sheet has come to the hot-pressing position 30 as shown in FIG. 4(E), the photosensitive-layer-covered beltlike support is cut with the rotary blade 17 and the fixed blade 18 as shown in FIG. 4(F).

The heated pressure rollers 7 and 8 are then opened and returned to their standby position and, simultaneously therewith, the hot-pressed base sheet is conveyed to the right with a conveying mechanism and sent from the apparatus to a next step. Thus, the laminator stands by in the state of FIG. 4(A) for the conveyance of the next base sheet 2.

Figure 5:
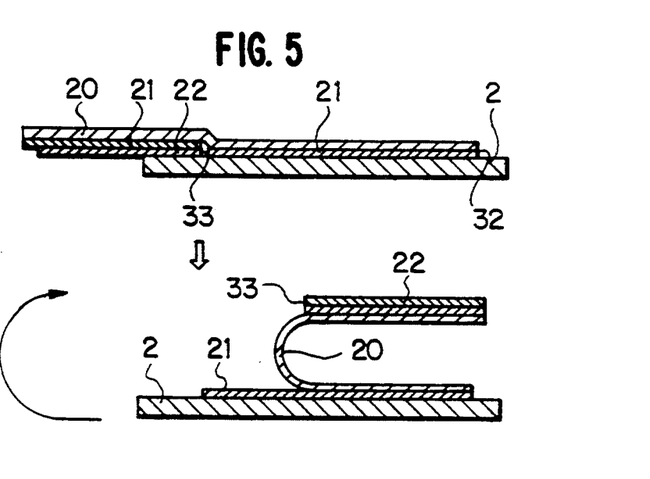
FIG. 5 shows sectional views illustrating a laminate of a base with a photosensitive-layer-covered beltlike support, wherein the laminate has been obtained by practicing the invention with the auto-cutting laminator.

FIG. 5 illustrates a laminate of a base sheet 2 with a photosensitive-layer-covered beltlike support, wherein the laminate has been obtained with the auto-cutting laminator.

The front edge of the photosensitive-layer-covered beltlike support is located at the position of the front end 32 of the photosensitive-layer laminating region of the base sheet 2. The rear end of the photosensitive-layer laminating region of the photosensitive-layer-covered beltlike support, at which end the protective film 22 and the photosensitive layer 21 have been cut, is located at the position of the rear end 33 of the photosensitive-layer laminating region of the base sheet 2. The photosensitive-layer laminating region of the base sheet 2, i.e., the region ranging from the front end 32 to the rear end 33, is covered with the photosensitive layer 21 adherent thereto.

Further, the cut rear edge of the support is located outside the rear edge of the base sheet 2. That is, the photosensitive layer 21 is not in contact with the base sheet 2 at least in the region ranging from the rear edge of the base sheet 2 to the rear end 33 of the photosensitive-layer laminating region, because of the presence of the protective film 22. The photosensitive layer 21 has been cut at the rear end 33 of the photosensitive-layer laminating region.

A method of peeling the support 20 from the photosensitive layer 21 is explained below.

The protruding part of the photosensitive-layer-covered beltlike support is pulled in the direction of the photosensitive-layer laminating region, whereby the photosensitive-layer-covered beltlike support is easily peeled off in the region ranging from the rear edge of the base sheet 2 to the rear end 33 of the photosensitive-layer laminating region because the protective film 22 does not adhere to the base sheet 2. After the photosensitive-layer-covered beltlike support has been thus peeled off to the rear end 33 of the photosensitive-layer laminating region at which the photosensitive layer 21 has been cut, peeling thereafter is easily attained at the interface between the photosensitive layer 21 and the support 20 because the adhesion between the support 20 and the photosensitive layer 21 is weaker than that between the base sheet 2 and the photosensitive layer 21.

Figure 6A:
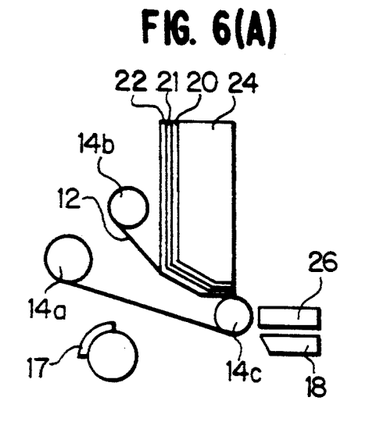
FIGS. 6(A) and 6(B) illustrate another method of peeling a protective film with an auto-cutting laminator.
Figure 6B:
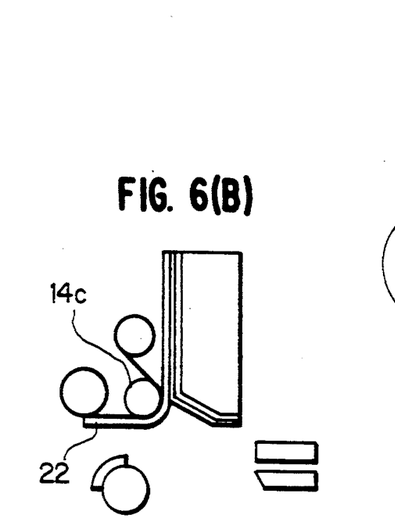

FIGS. 6(A) and 6(B) illustrate another method of protective-film peeling with an auto-cutting laminator.

Rotary cutters 17 and 18 cut a photosensitive-layer-covered beltlike support having a protective film 22. The front edge part of the resulting photosensitive-layer-covered beltlike support is then wound around the tip of a vacuum plate 24 in preparation for provisional bonding, upon which an adhesive tape pushing roller 14c on which an adhesive tape 12 has been wound moves to the tip of the vacuum plate 24 near support holding member 26 while unwinding the adhesive tape 12 to push the adhesive tape 12 against the front edge of the photosensitive-layer-covered beltlike support, as shown in FIG. 6(A). The adhesive tape 12 adheres to the protective film 22, and a protective film recovering roll 14a winds thereon the protective film 22 adherent to the adhesive tape 12, while the adhesive tape pushing roller 14c moves to its original position, as shown in FIG. 6(B). Thus, the protective film is peeled off to the rear end of the photosensitive-layer laminating region at which the protective film has been cut with a protective film/photosensitive layer cutter, and the peeled protective film is recovered.

In this method, the rotary cutters 17 and 18 thus cut the photosensitive-layer-covered beltlike support to simultaneously form both the rear end of the region in which the protective film is to be left unremoved and the front edge of the photosensitive-layer-covered beltlike support to be laminated to the next base sheet. The protective film/photosensitive layer cutter cuts the layers only at the rear end of the photosensitive-layer laminating region of the photosensitive-layer-covered beltlike support.

Since the photosensitive-layer-covered beltlike support which is being cut with the rotary blade 17 and the fixed blade 18 still has the protective film 22 in the above-described method, there is an advantage that the deposition of cutting debris or other dust particles on the photosensitive layer 21 can be prevented, and hence defects can be diminished.

From the above, it can be seen that one example of a preferred embodiment of the present invention is directed to a process wherein before protective film is removed in such a manner that the part of the protective film which corresponds to the non-laminating region of the base is left on the photosensitive layer, the protective film and the photosensitive layer are cut along a boundary where protective film is to be left on the photosensitive layer.

Also, it can be seen that one example of a preferred embodiment of the present invention is directed to a process wherein after the base and photosensitive-layer-covered support are hot-pressed with nipping, a region of the support in which the protective film remains on the photosensitive layer is pulled to peel the support from the photosensitive layer in the laminating region.

The present invention has the effects of eliminating the defects caused by the deposition of photosensitive-layer debris in the laminating region and of preventing photosensitive-layer adhesion to a base in its non-laminating region, by a process in which a base and a photosensitive-layer-covered support are hot-pressed with nipping with a protective film being left on the photosensitive layer in its region corresponding to the non-laminating region of the base, and by a process which comprises cutting beforehand the protective film and the photosensitive layer along the boundary with the region in which the protective film is to be left on the photosensitive layer, removing the protective film in such a manner that its part in the non-laminating region is left unremoved, hot-pressing the base and the photosensitive-layer-covered support with nipping, and then pulling the region of the support in which the protective film remains on the photosensitive layer to thereby peel the support from the photosensitive layer in the laminating region.

While the invention has been described in detail and with reference to specific embodiments thereof, it will be apparent to one skilled in the art that various changes and modifications can be made therein without departing from the spirit and scope thereof.

What is claimed is:

1. A process for laminating a photosensitive layer which comprises providing (A) a base having a laminating region and a non-laminating region, and (B) a support having thereon, in order, a photosensitive layer and a protective film, where part of the protective film corresponds to the laminating region and part of the protective film corresponds to the non-laminating region, removing the part of the protective film which corresponds to the laminating region from the photosensitive layer such that the photosensitive layer can be laminated to the base in the laminating region, feeding the base and the support having thereon the photosensitive layer from which protective film has been removed to a nip between a pair of heated pressure rollers, passing the base and photosensitive-layer-covered support forward through the rollers while the base and photosensitive-layer-covered support are being nipped and hot-pressed by the rollers, with the photosensitive layer being in contact with the laminating region of the base to laminate the photosensitive layer to the base, and then peeling the support from the photosensitive layer, wherein the removal of protective film from the photosensitive layer is conducted in such a manner that the part of the protective film which corresponds to the non-laminating region of the base is left on the photosensitive layer.

2. A process as claimed in claim 1, wherein before protective film is removed in such a manner that the part of the protective film which corresponds to the non-laminating region of the base is left on the photosensitive layer, the protective film and the photosensitive layer are cut along a boundary where protective film is to be left on the photosensitive layer.

3. A process as claimed in claim 2, wherein after the base and photosensitive-layer-covered support are hot-pressed with nipping, a region of the support in which the protective film remains on the photosensitive layer is pulled to peel the support from the photosensitive layer in the laminating region.

4. A process as claimed in claim 1, wherein the base is heated with a heater to about 50° to 110 ° C. prior to being fed to the nip between the pair of heated pressure rollers.

5. A process as claimed in claim 1, wherein the base is a copper-clad glass-epoxy resin base.

6. A process as claimed in claim 1, wherein the base is a glass sheet.

7. A process as claimed in claim 1, wherein the heated pressure rollers are kept heated at about 100° to 150 ° C.

8. A process as claimed in claim 1, wherein the support is polymer film.

9. A process as claimed in claim 1, wherein the support is made from poly(ethylene terephthalate).

10. A process as claimed in claim 1, wherein the support is made from polypropylene.

11. A process as claimed in claim 1, wherein the support has a thickness of 20 to 100 $\mu$m.

12. A process as claimed in claim 1, wherein the photosensitive layer has a thickness of 0.5 to 10 $\mu$m.

13. A process as claimed in claim 1, wherein an interlayer is present between the support and the photosensitive layer.

14. A process as claimed in claim 13, wherein the interlayer is made from poly(vinyl alcohol).

15. A process as claimed in claim 13, wherein the interlayer has a thickness of 10 to 50 $\mu$m.

* * * * *